United States Patent [19]

DeBrosse et al.

[11] Patent Number: 5,534,732
[45] Date of Patent: Jul. 9, 1996

[54] SINGLE TWIST LAYOUT AND METHOD FOR PAIRED LINE CONDUCTORS OF INTEGRATED CIRCUITS

[75] Inventors: John K. DeBrosse, Burlington; Jenifer E. Lary, Hinesburg; Edmund J. Sprogis, Underhill, all of Vt.

[73] Assignee: International Business Machines Corporation, Armonk, N.Y.

[21] Appl. No.: 567,437

[22] Filed: Dec. 4, 1995

Related U.S. Application Data

[63] Continuation of Ser. No. 290,408, Aug. 15, 1994, abandoned.

[51] Int. Cl.$^6$ .................................................. H01L 27/10
[52] U.S. Cl. ........................ 257/776; 257/664; 257/907; 365/63
[58] Field of Search ................................. 257/907, 776, 257/664; 365/63

[56] References Cited

U.S. PATENT DOCUMENTS

| | | | |
|---|---|---|---|
| 4,914,502 | 4/1990 | Lebowitz et al. | 357/68 |
| 5,097,441 | 3/1992 | Cho et al. | 365/51 |

FOREIGN PATENT DOCUMENTS

| | | |
|---|---|---|
| 0262780A1 | 4/1988 | European Pat. Off. . |
| 0352893 | 1/1990 | European Pat. Off. . |
| 0523997A1 | 1/1993 | European Pat. Off. . |
| 2668640 | 4/1992 | France . |
| 4000429 | 7/1990 | Germany . |
| 2-193393 | 7/1990 | Japan . |

OTHER PUBLICATIONS

Yoshihara et al., "A Twisted Bit Line Technique for Multi-Mb DRAMs," IEEE International Solid-State Circuits Conference, pp. 238-239, Feb. 1988.

Oowaki et al., "A 33 ns 64 Mb DRAM," IEEE International Solid-State Circuits Conference, pp. 114-115, Feb. 1991.

*Primary Examiner*—William D. Larkins
*Attorney, Agent, or Firm*—Heslin & Rothenberg

[57] ABSTRACT

An interconnection array layout and method are provided for a plurality of paired line conductors of a given length extending principally parallel. A single crossing region traverses the paired line conductors intermediate the given length, wherein the line conductors of each pair of line conductors cross such that inter-pair capacitive coupling is matched. Intra-pair capacitive coupling is avoided by separating the line conductors of each pair of line conductors by two pitches and disposing therebetween a line conductor of a different pair of line conductors. Applications include semiconductor memory arrays, such as DRAM structures, and address/data busses wherein paired true/complement line conductors are employed.

15 Claims, 8 Drawing Sheets

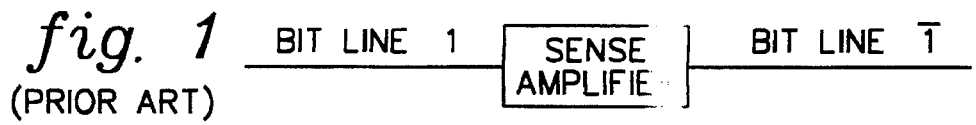
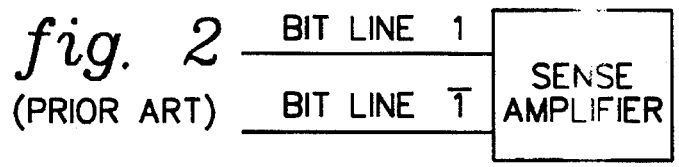
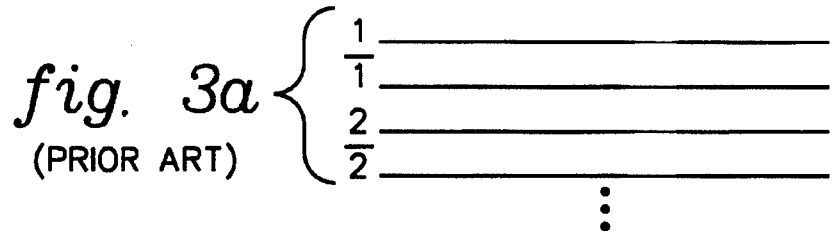
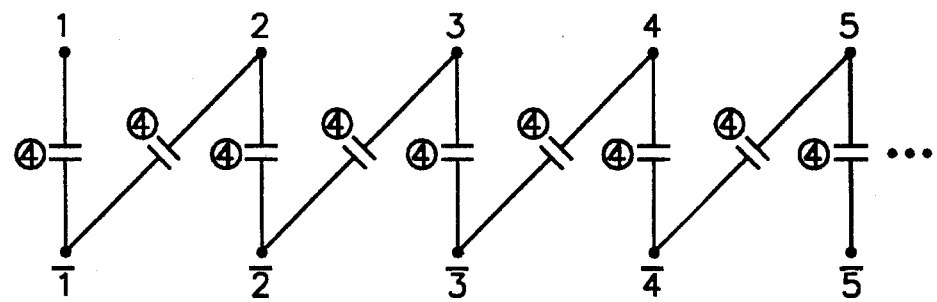
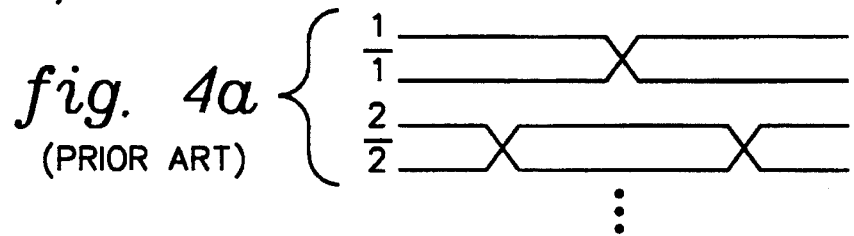
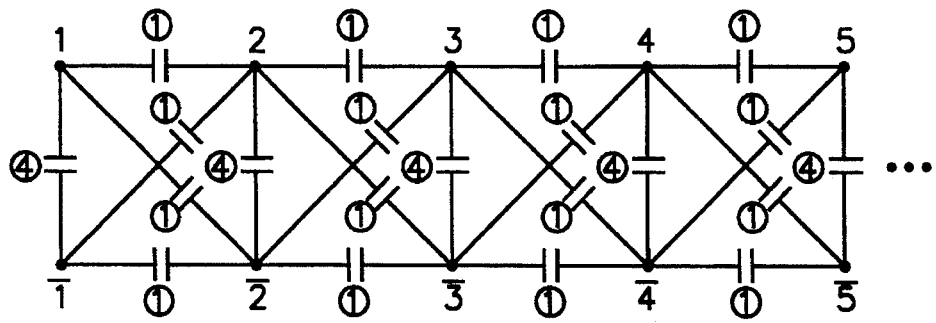

SINGLE TWIST LAYOUT AND METHOD FOR PAIRED LINE CONDUCTORS OF INTEGRATED CIRCUITS

This application is a continuation of application Ser. No. 08/290,408, filed Aug. 15, 1994, now abandoned.

TECHNICAL FIELD

This invention relates in general to integrated circuit layout of an interconnection array comprising a plurality of paired, parallel disposed line conductors. More particularly, the invention relates to a line "twist" layout and method for such an interconnection array wherein intra-pair capacitive coupling is avoided and inter-pair capacitive couplings are matched.

BACKGROUND ART

Semiconductor integrated circuits typically are formed by metal-oxide semiconductor (MOS) or bipolar transistors that are integrated at a planar major surface of a silicon chip. Electrical interconnections between various transistors, as well as between certain transistors and access pins, have taken the form of two (or more) "levels" of interconnections, i.e., electrically connecting lines in the form of metallization strips running along two (or more) essentially planar surfaces that are oriented mutually parallel to, and are insulated from, both each other and the top planar surface of the chip by suitable insulating layers. Interconnection vias in the insulating layers are provided whenever needed for the desired circuit interconnections.

In a variety of integrated circuits, such as random access memories (RAMs) and logic circuits, the electrical circuit itself requires interconnections by means of a number of electrically conducting lines which conventionally are geometrically arranged in the form of an array of mutually parallel metallization strips. For example, in a dynamic RAM (DRAM) an array of parallel bit lines coupled to an array of memory cells (and addressed by an array of parallel word lines) can contain hundreds (or more) of parallel lines.

These bit lines, which typically comprise paired true and complement lines, can give rise to electrical cross-coupling or "cross-talk". For example, access to any given bit line may spuriously influence memory cells connected to adjacent bit lines. The term "pattern sensitivity" is applied to this undesirable phenomenon. The problem can arise in other interconnection arrays also, such as address busses and data busses wherein similarly paired, parallel disposed line conductors are employed. In any environment, such cross-talk can result in undesirable errors. Thus, although the concepts of the present invention are presented principally herein in connection with semiconductor memory arrays, they are equally applicable to any integrated circuit device employing a plurality of paired line conductors extending substantially parallel.

Architecture of semiconductor memories is roughly divided into two types, namely, open bit line architecture and folded bit line architecture. Both architecture types are well known in the art and detailed information on each type, along with numerous variations thereon, is readily available. FIG. 1 comprises a generalized diagram of an open bit line architecture, while FIG. 2 presents a closed bit line architecture. In an open bit line array, paired sets of bit lines (such as bit line 1 & bit line $\bar{1}$) are located on opposites sides of the respective sense amplifier. A significant advantage of this open structure is that a memory cell may be disposed at each word line—bit line crossing in the memory array. Unfortunately, the arrangement is also susceptible to differential noise being generated due to the physical separation of each true and complement pairing.

One solution to this differential noise has been to place the paired bit lines on the same side of the sense amplifier, thereby creating a folded bit line architecture. Differential noise problems are decreased in a folded bit line structure since both bit lines experience the same disturbance, thereby cancelling the effect of the disturbance. However, due to an ever decreasing spacing between bit lines, adjacent lines have now become differential noise sources. Noise can either be generated within a bit line pairing (intra-pair) or from one bit line pairing to another bit line pairing (inter-pair).

Several bit line "twisting" schemes have been proposed to reduce the effects of this bit line-to-bit line capacitance. For example, see Yoshihara et al., entitled "A Twisted Bit Line Technique For Multi-Mb DRAMS," IEEE International Solid-State Circuits Conference, pp. 238–239, February 1991; and Oowaki et al., entitled "A 33 ns 64 Mb DRAM," IEEE International Solid-State Circuits Conference, pp. 114–115, February 1991. These articles present several different line twist layouts for reducing intra-pair capacitive coupling and/or matching inter-pair capacitive couplings. Two of these layouts are discussed further herein with reference to FIGS. 3a–4b.

The present invention presents a line conductor layout and twist method which optimize density of the integrated circuit's interconnection array while avoiding intra-pair capacitive coupling and establishing matching of inter-pair capacitive couplings.

DISCLOSURE OF INVENTION

Briefly summarized, in one aspect the invention comprises an interconnection array having a plurality of paired line conductors of a given length extending principally parallel to each other. A single crossing region is disposed transverse the paired line conductors such that first and second regions of the line conductors are defined on opposite sides of the single crossing region. The line conductors of each pair of line conductors of the plurality of paired line conductors are separated in the first region and in the second region such that capacitive coupling within each pair of line conductors is avoided. Further, the line conductors of the plurality of paired lined conductors cross within the single crossing region such that capacitive couplings are matched between each pair of line conductors and the remaining plurality of paired line conductors.

In another aspect, an interconnection array is provided having a plurality of paired line conductors of a given length extending principally parallel to each other. Again, a single crossing region is disposed transverse the line conductors such that first and second regions are defined on opposite sides of the single crossing region. In the first region, a first line conductor of a first pair of line conductors is disposed adjacent to a first line conductor of a second pair of line conductors and a second line conductor of the first pair of line conductors is disposed adjacent to a second line conductor of the second pair of line conductors. In the second region, the first line conductor of the first pair of line conductors is disposed adjacent to the second line conductor of the second pair of line conductors and the first line conductor of the second pair of line conductors is disposed adjacent to a second line conductor of a third pair of line conductors. With such an arrangement, capacitive coupling within the first pair of line conductors and within the second pair of line conductors is avoided and capacitive couplings between the line conductors of the first pair and the second pair of line conductors are matched.

In still another aspect, a layout method is presented for an integrated circuit's interconnection array comprised of a plurality of paired line conductors of given length. The layout method includes the steps of: forming a first region by disposing a first part of the line conductors substantially parallel with a center-to-center spacing of two pitches between paired line conductors, and with another line conductor disposed therebetween; forming a single crossing region including crossing the line conductors of each pair once; and forming a second region by disposing a second part of the line conductors substantially parallel with a center-to-center spacing of two pitches between paired line conductors and with another line conductor disposed therebetween.

The novel interconnection array and layout method presented herein simultaneously avoids intra-pair capacitive coupling and provides matched inter-pair capacitive couplings. Because there is only a single "twist" region, the interconnection array layout is more dense than prior art layouts requiring multiple "twist" regions. Thus, by way of example, in a semiconductor memory array employing a folded bit line architecture improved cell density is attainable. Further, there is a reduction in initial static signals and coupling noise from adjacent lines. The layout is applicable to any interconnection array having a plurality of paired true/complement line conductors, such as circuit address/ data busses, and reduced power consumption is attainable in comparison with previous layout approaches.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 1 is a simplified schematic of a conventional open bit line memory architecture;

FIG. 2 is a simplified schematic of a conventional folded bit line memory architecture;

FIG. 3a is an example of a conventional "untwisted" interconnection array having a plurality of paired line conductors;

FIG. 3b is an equivalent circuit representation of the interconnection array of FIG. 3a with sample intra-pair and inter-pair capacitive couplings shown;

FIG. 4a is an example of a conventional "twisted" interconnection array, again having a plurality of paired line conductors;

FIG. 4b is an equivalent circuit representation for the interconnection array of FIG. 4a, showing sample intra-pair and inter-pair capacitive couplings;

BEST MODE FOR CARRYING OUT THE INVENTION

Figure 5:
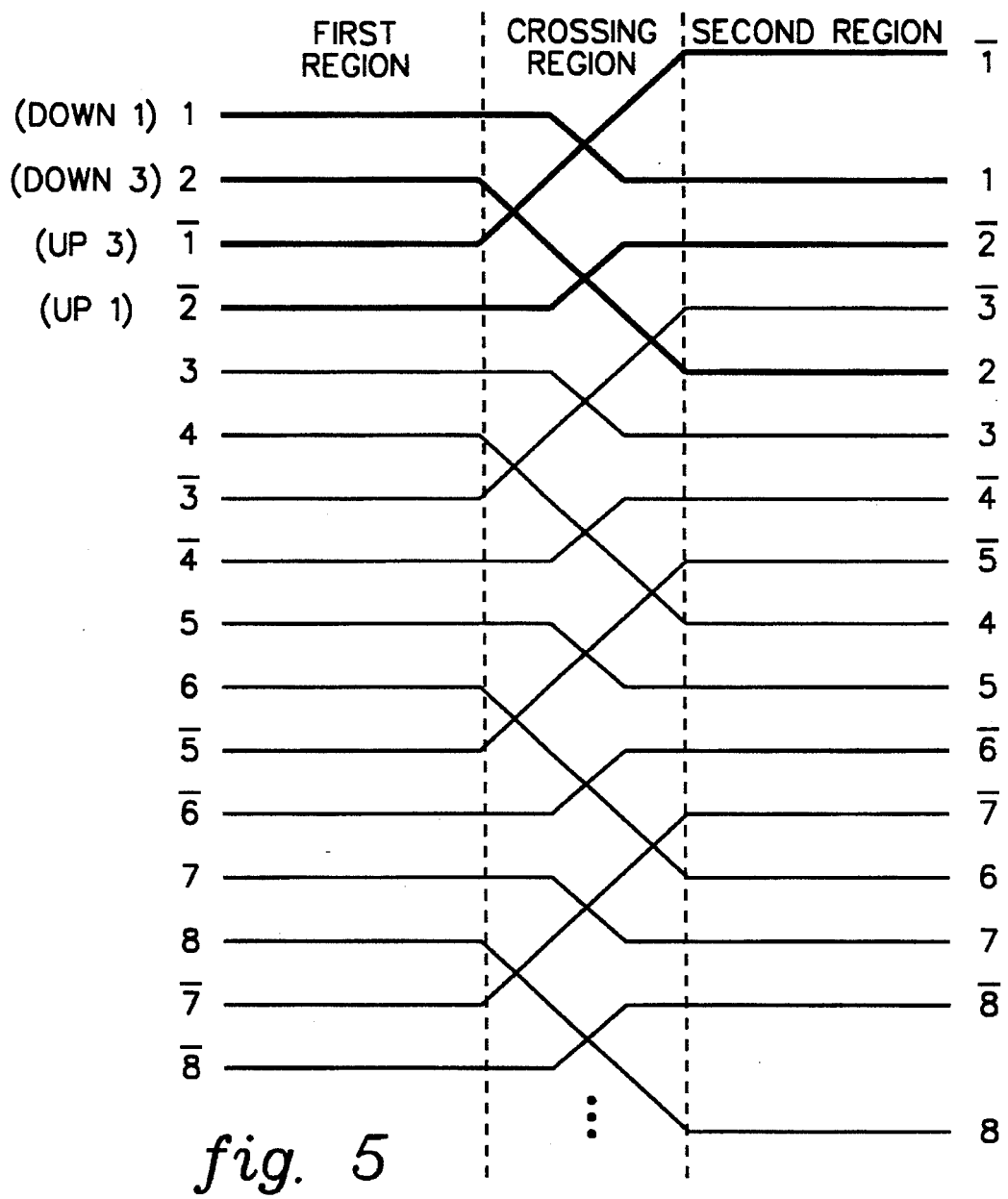
FIG. 5 is a partial schematic of a single "twist" interconnection array layout in accordance with the present invention.

Reference is now made to the drawings in which use of the same reference numbers throughout different figures designate the same or similar components. Also, for simplicity, the total line-to-line capacitance attached to one line conductor has been normalized to eight (8).

As noted initially herein, recent increases in the number of line conductors in circuit interconnection arrays and decreases in the center-to-center spacing between line conductors (i.e., the "pitch") means that adjacent line conductors have now become differential noise sources. The effects of these sources include, by way of example, a reduction in initial static signal strength and the presence of differential coupling noise.

Before discussing interconnection array layouts in accordance with the present invention, two existing layouts are briefly discussed for comparison. The first array layout comprises an "untwisted" arrangement (see FIG. 3a) wherein paired line conductors are disposed in parallel. As shown by the equivalent circuit representation of FIG. 3b, such a layout has significant intra-pair capacitive coupling (i.e., 4 "units" wherein 1 "unit" might comprise a pf) and unbalanced inter-pair capacitive couplings. Thus, this "untwisted" arrangement essentially fails to address the line-to-line noise problem.

Various noise cancellation approaches, generally referred to as "twisted" line conductor layouts, have been made to address the line-to-line capacitive coupling effects, see, e.g., the above-referenced articles. In many "twisted" interconnection arrays, line conductors are crossed such that the conductors of each line conductor pair have the same capacitive couplings to adjacent lines in the array. However, intra-pair capacitive coupling may remain. By way of example, reference the approach depicted in FIGS. 4a & 4b. Further, note that in the "twisted" array approach of FIG. 4a, three distinct crossing regions are required, meaning that the resultant interconnection array is necessarily less dense than an interconnection array utilizing only one crossing region.

Traditionally, the noise cancelling effect of "twisted" line conductors has been enhanced by increasing the number of times each line conductor undergoes twisting in an interconnection array. Unfortunately, each crossing region requires extra space within the interconnection array and processing steps. In particular, when designing an interconnection array extra space must be allocated for an upper layer of metal to interconnect respective twisted segments of the line conductor. An object of the present invention, therefore, is to attain the enhanced differential noise cancellation properties of a multiple "twist" interconnection array, while only introducing one crossing region into the array.

To restate, the inventive concepts presented herein apply to any interconnection array having a plurality of paired line conductors of a given length extending substantially parallel. Since only one crossing (twist) region is required, improved density for most applications is attained, i.e., in comparison with prior art "multiple" twist arrangements. For example, in a semiconductor memory structure, improved memory cell density can be achieved with fewer twist regions.

The layout approach of the present invention is to separate on a planar surface the true and complement lines of each pair of parallel line such that the lines center-to-center spacing comprises two pitches. A first region and a second region are defined on opposite sides of a crossing region disposed transverse the line conductors and intermediate their given length. Preferably, the crossing (or twisting) region is disposed intermediate the ends of the line conductors.

Each pair of line conductors in the first region has a line conductor disposed therebetween and a different line conductor is disposed between corresponding true and complement lines in the second region. The arrangement of line conductors in the first region (i.e., left side of the crossing region) is fixed, as is the arrangement of line conductors in the second region. However, the arrangement of line conductors in the second region may be moved one or more pitches up or down with respect to the first region's arrangement of line conductors without departing from the advantages of the present invention. Thus, numerous embodiments of interconnection array layouts in accordance with this invention are possible, five of which are depicted in FIGS. 5, 7–10 and described below.

Although the embodiments of FIGS. 5, 7–10 appear different, the interconnection arrays actually comprise only slight variations on common themes. For example, in the embodiments depicted, the complementary line conductors, (e.g., $\overline{1}, \overline{2}, \overline{3}, \overline{4}$ ...) are displaced two pitches "down" in the first region from the corresponding true line conductors (e.g., 1, 2, 3, 4 ..., respectively) and two pitches "up" from the true line conductors in the second region of the array. As used herein, the "pitch" comprises the center-to-center spacing between two adjacent line conductors in the interconnection array. Further, the "up" direction means towards the top of a page, while the "down" direction means towards the bottom of a page. When viewed planarly, the terms "left" and "right" can be substituted for "up" and "down", respectively. Again, note that for each interconnection array depicted, each pairing of line conductors is spaced apart by a line conductor in the first region and a different line conductor in the second region. For convenience, the line conductors of each line conductor pairing are labeled at both ends of the simplified interconnection arrays depicted in FIGS. 5 & 7–10.

By way of example, the first two line conductor pairings $(1,\overline{1}$ and $2,\overline{2})$ of each layout are discussed herein, since for each embodiment these pairings comprise a pattern which is repeated throughout the respective interconnection array.

Referring to the embodiment of FIG. 5, in the first region a first line conductor (1) of a first pair of line conductors (1, $\overline{1}$) is disposed adjacent to a first line conductor (2) of a second pair of line conductors (2,$\overline{2}$). A second line conductor ($\overline{1}$) of the first pair of line conductors (1,$\overline{1}$) is disposed adjacent to a second line conductor ($\overline{2}$) of the second pair of line conductors (2,$\overline{2}$). In contrast, in the second region (i.e., opposite side of the crossing region), the first line conductor (1) of the first pair of line conductors (1,$\overline{1}$) is disposed adjacent to the second line conductor ($\overline{2}$) of the second pair of line conductors, and the first line conductor (2) of the second pair of line conductors (2,$\overline{2}$) is disposed adjacent to a second line conductor ($\overline{3}$) of a third pair of line conductors (3,$\overline{3}$). The above-described arrangement of line conductors forms a pattern that is repeated throughout the interconnection array. The pattern of FIG. 5 can thus be termed "down 1," "down 3," "up 3" and "up 1" from lines 1, 2, $\overline{1}$, $\overline{2}$ as shown.

Figure 6:
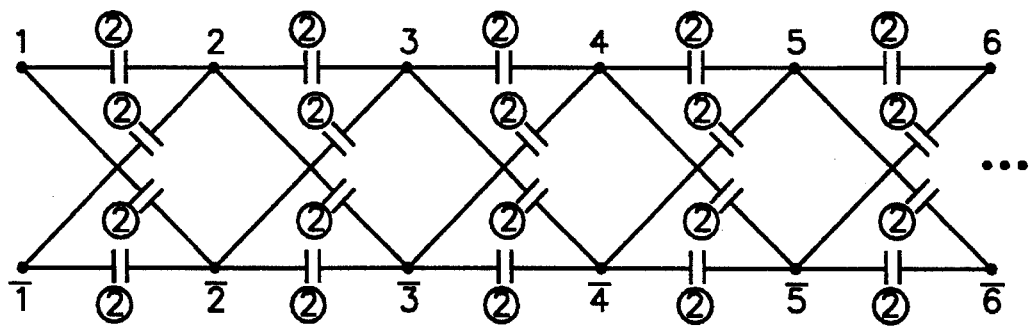
FIG. 6 is an equivalent circuit representation of the interconnection array of FIG. 5, showing no intra-pair capacitive coupling and matched inter-pair capacitive couplings.

An equivalent representation of the capacitive couplings for the interconnection array of FIG. 5 is presented in FIG. 6, wherein the line conductors are depicted as nodes. As shown, there is no intra-pair capacitive coupling between corresponding true and complement line conductors (i.e., 1, $\overline{1}$; 2,$\overline{2}$; 3,$\overline{3}$; 4,$\overline{4}$ ... ). Further, capacitive couplings between pairs of line conductors are matched. Thus, the stated goals are achieved by the interconnection array presented in FIG. 5. A similar equivalent circuit can be written for each of the embodiments shown in FIGS. 7–10, all of which can be generated from FIG. 5 by shifting the first or second region arrangements "up" or "down" with respect to each other. Specifically, the line conductors on one side of the crossing region may all be shifted "up" or "down" one or more pitches relative to the line conductors on the other side of the crossing region without affecting the noise cancellation properties of the interconnection array.

Figure 7:
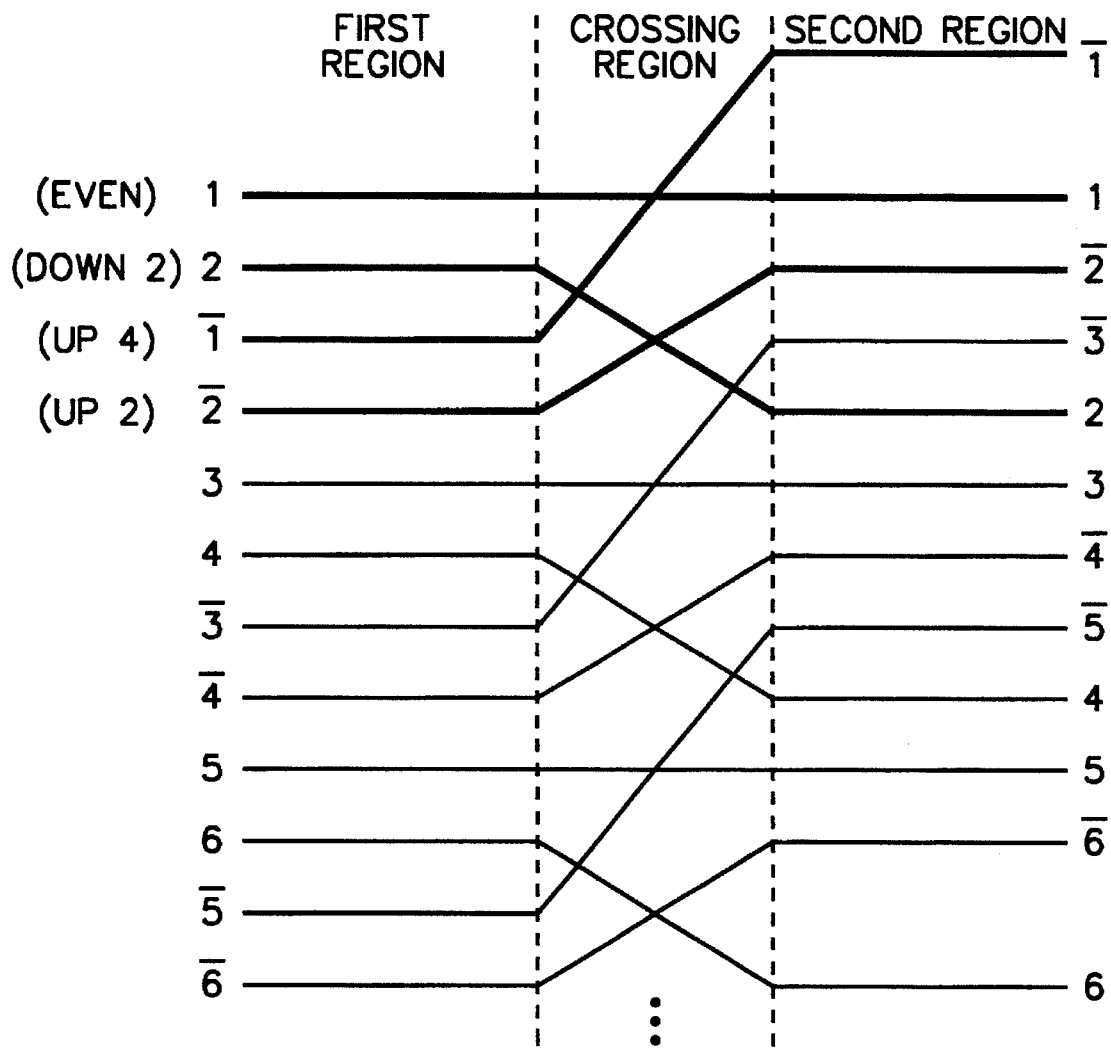
FIG. 7 is a partial schematic of another embodiment of a single twist interconnection array in accordance with the present invention.
Figure 8:
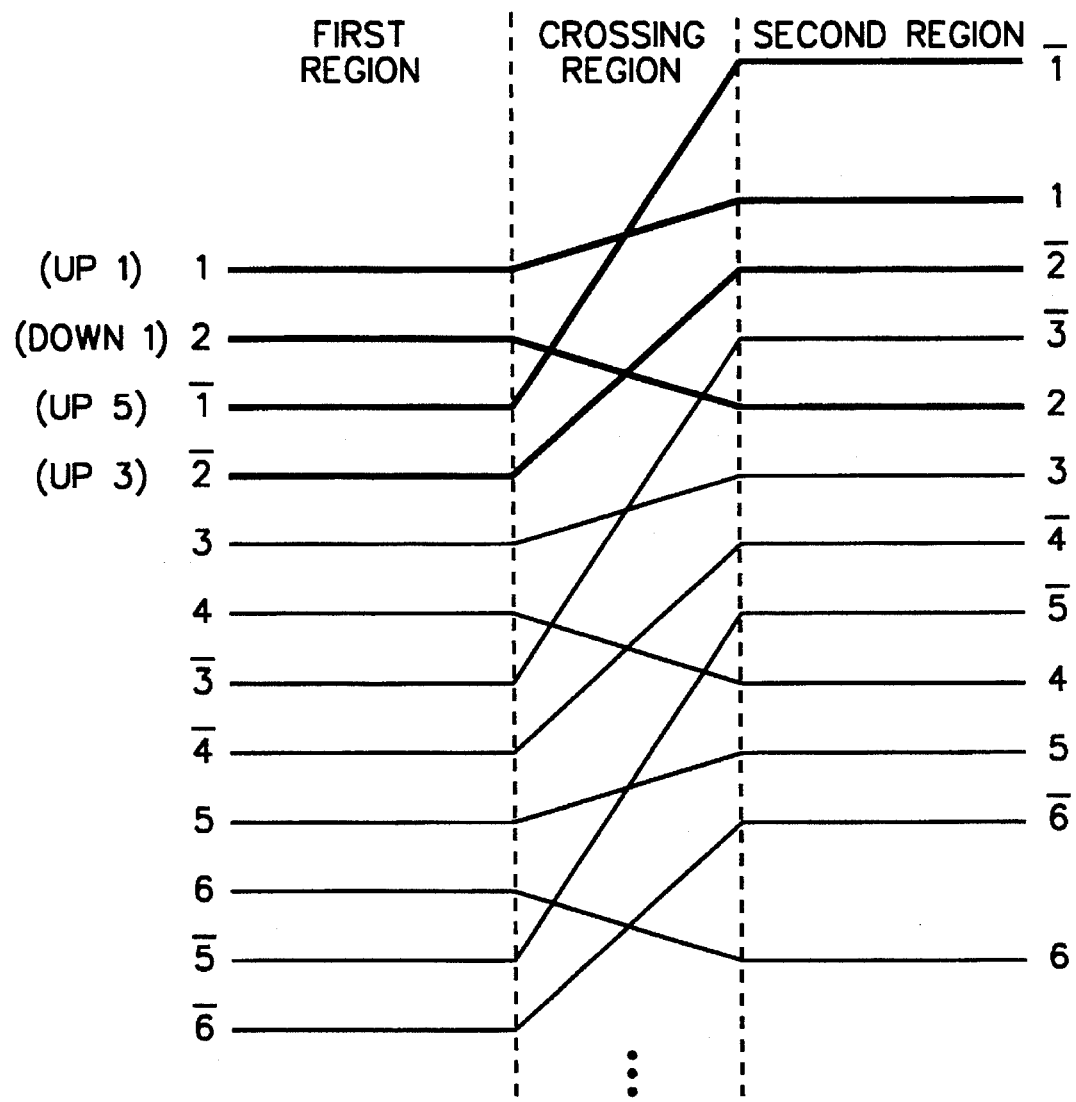
FIG. 8 is a partial schematic of a further embodiment of a single twist interconnection array in accordance with the present invention.
Figure 9:
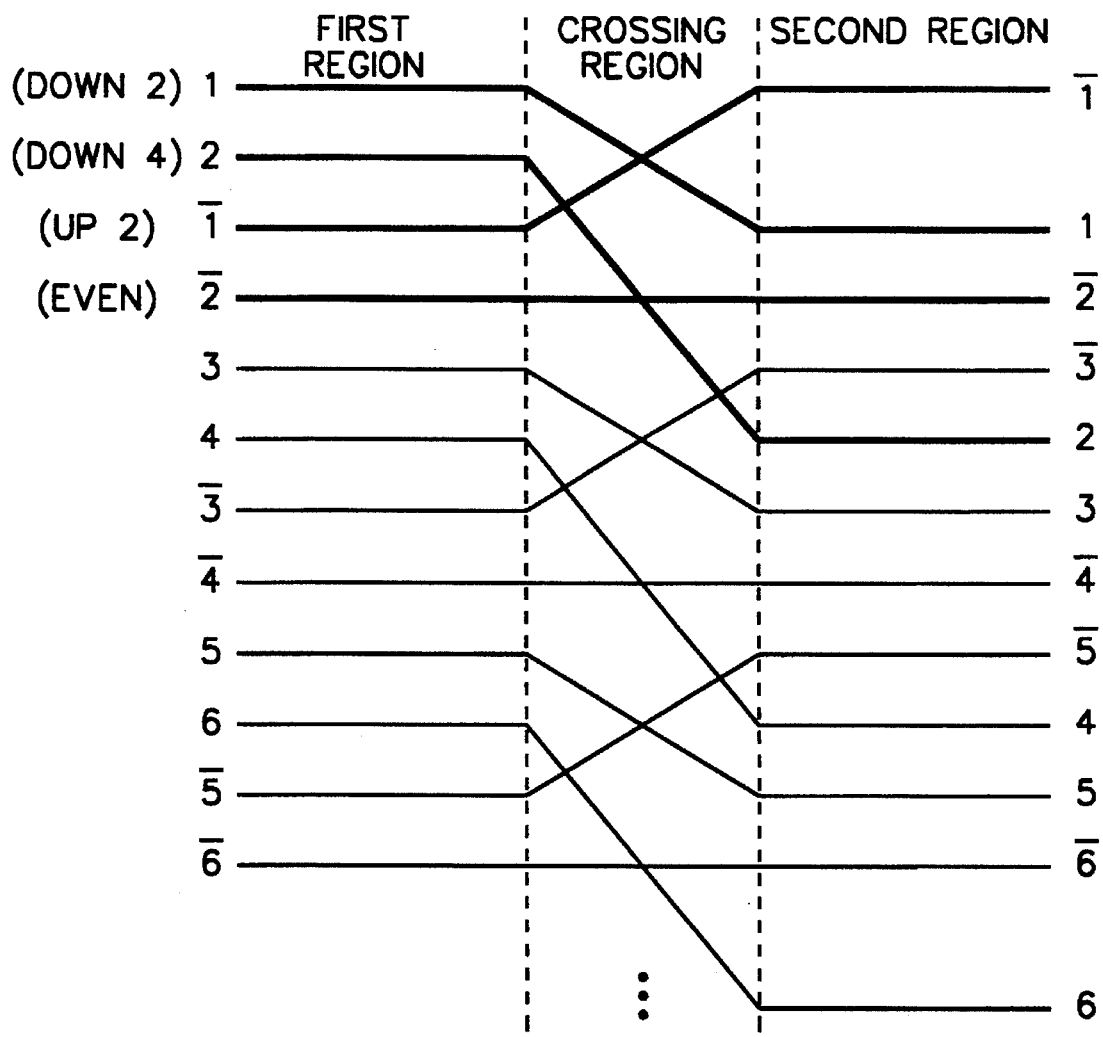
FIG. 9 is a partial schematic of still another embodiment of a single twist interconnection array in accordance with the present invention.
Figure 10:
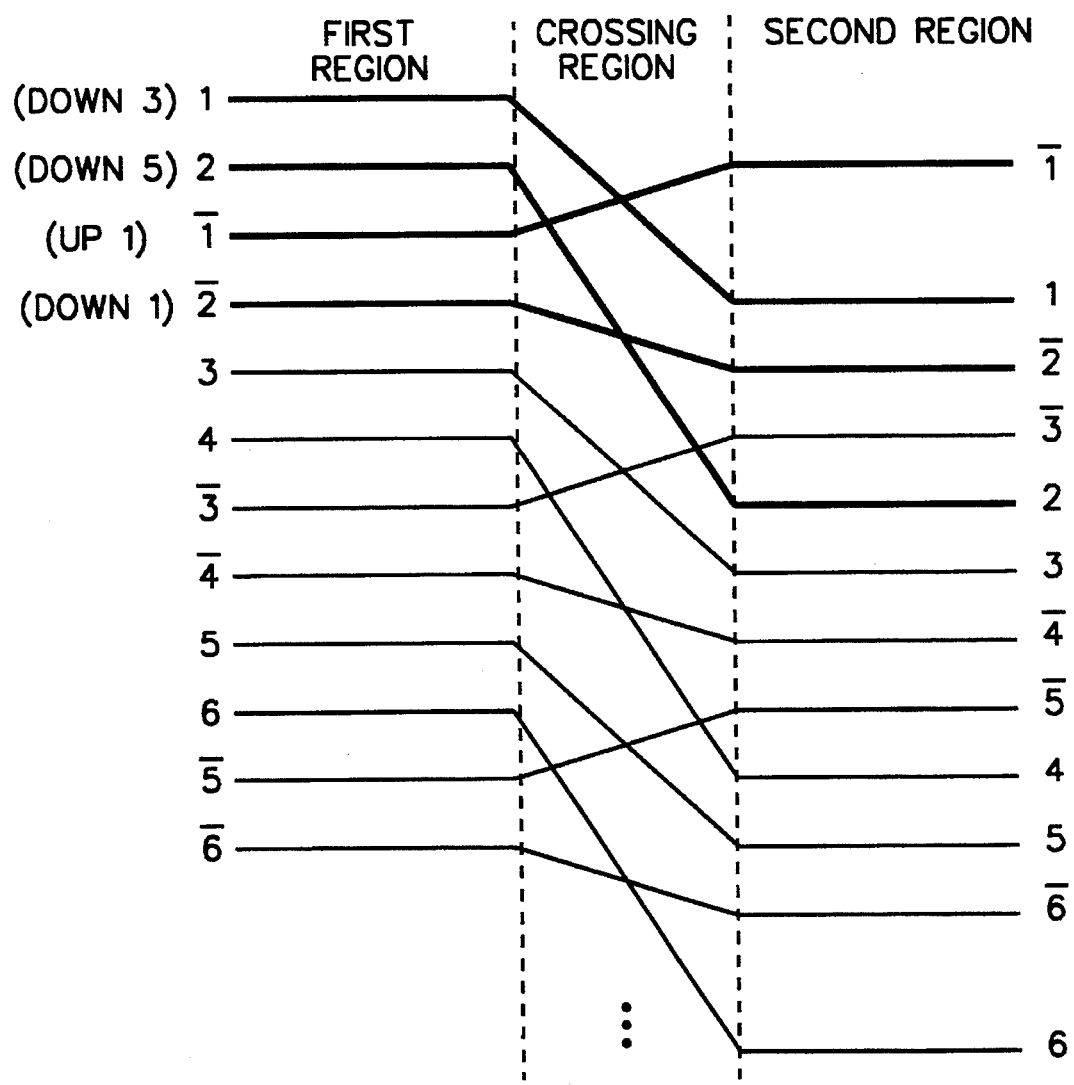
FIG. 10 is a partial schematic of a yet further embodiment of a single twist interconnection array in accordance with the present invention.

The general discussion presented above, including the description of the disposition of line conductors of the first pairing of line conductors (1,$\overline{1}$) and the second pairing of line conductors (2,$\overline{2}$) applies to the line conductor arrangement of FIG. 7, along with the other arrangements depicted in FIGS. 8–10. In FIG. 7, the first line conductor (1) of the first pair of line conductors (1,$\overline{1}$) is aligned in the first region and second region through the crossing region, i.e., there is no change in pitch. The second line conductor ($\overline{1}$) of the first pair of line conductors (1,$\overline{1}$) moves "up" four pitches from the first region to the second region. The first line conductor (2) of the second pair of line conductors (2,$\overline{2}$) moves "down" two pitches in the crossing region from the first region to the second region. (Note with respect to this line conductor that some of the line conductors of the pairs of line conductors traverse multiple (i.e., three) line conductors within the crossing region.) The second line conductor ($\overline{2}$) of the second pair of line conductors (2,$\overline{2}$) moves "up" two pitches from the first region to the second region. The pattern of this embodiment is thus "even," "down 2," "up 4," and "up 2," for lines 1, 2, $\overline{1}$, $\overline{2}$.

In the embodiment of FIG. 8, the first line conductor (1) of the first pair of line conductors (1,$\overline{1}$) moves "up" one pitch in the crossing region, while the second line conductor ($\overline{1}$) of the first pair of line conductors (1,$\overline{1}$) moves "up" five pitches from the first region to the second region. The first line conductor (2) of the second pair of line conductors (2, $\overline{2}$) moves "down" one pitch across the crossing region, while the corresponding second line conductor ($\overline{2}$) moves "up" three pitches across the crossing region. The pattern of this embodiment can be expressed as "up 1," "down 1," "up 5," and "up 3," for lines 1, 2, $\overline{1}$, $\overline{2}$.

The embodiment of FIG. 9 is essentially a variation on the embodiment of FIG. 7. This pattern consists of the first line conductor (1) dropping two pitches from the first region to the second region, with the second line conductor ($\overline{1}$) of the first pair of line conductors (1,$\overline{1}$) rising two pitches from the first region to the second region. In addition, the first line conductor (2) of the second pair of line conductors (2,$\overline{2}$) drops four pitches, while the second line conductor ($\overline{2}$) is aligned from the first region across the crossing region to the second region. This pattern, again a variation on that presented in FIG. 7, is referred to as "down 2," "down 4," "up 2," and "even," for lines 1, 2, $\overline{1}$, $\overline{2}$.

Similarly, the interconnection array of FIG. 10 is a variation on that presented in FIG. 8. The pattern comprises moving the first line conductor (1) of the first pair of line conductors (1,$\overline{1}$) "down" three pitches from the first region to the second region, raising the second line conductor ($\overline{1}$) "up" one pitch from the first region to the second region, and dropping the first line conductor (2) of the second pair of line conductors (2,$\overline{2}$) "down" five pitches and the corresponding second line conductor ($\overline{2}$) "down" one pitch over the crossing region. This pattern is referred to as "down 3," "down 5," "up 1," and "down 1," for lines 1, 2, $\overline{1}$, $\overline{2}$.

Again, numerous variations on the basic patterns presented herein are possible. Such variations can be obtained, for example, by maintaining the line conductors of the first region fixed and shifting the line conductors of the second region "up" or "down" one or more pitches.

Figure 11:
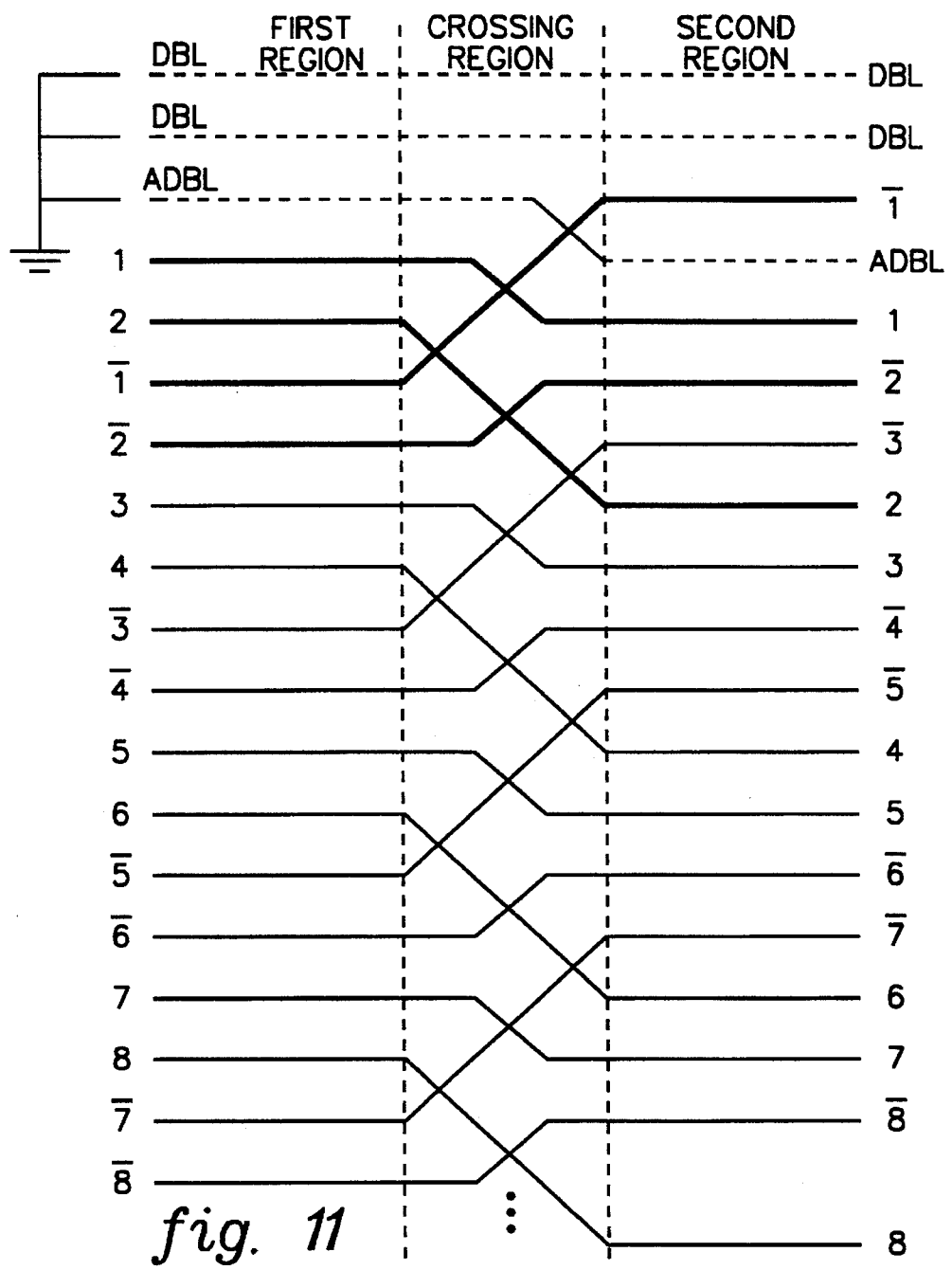
FIG. 11 depicts the interconnection array layout of FIG. 5 with a first pair of line conductors $(1,\bar{1})$ shown adjacent to an edge of the interconnection array, along with the use of an additional "dummy" bit line (ADBL)
Figure 12:
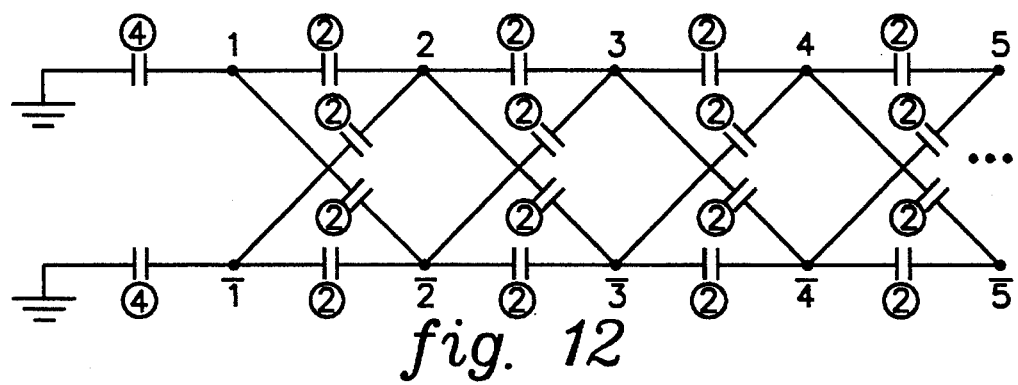
FIG. 12 is an equivalent circuit representation for the interconnection array layout of FIG. 11.

In a memory array configuration, dummy bit lines (DBLs) are conventionally placed along the edges of the array to account for array edge effects. Pursuant the schemes presented herein, additional dummy bit line(s) (ADBL) is (are) inserted to terminate the particular twisting pattern. By way of example, the pattern of FIG. 5 is repeated in FIG. 11 with an additional "dummy" bit line (ADBL) shown inserted. In certain patterns (for example, the pattern of FIGS. 8 & 10), two additional bit lines are required to terminate the pattern. This allows the first "real" bit line pair (1,$\overline{1}$) along the edge of the memory array to still have matched capacitive couplings, which is confirmed in the alternative circuit representation of FIG. 12. Again, the total capacitive coupling experienced by a line conductor is assumed to have been normalized to eight "units" (e.g., ρfs) for discussion.

Figure 13:
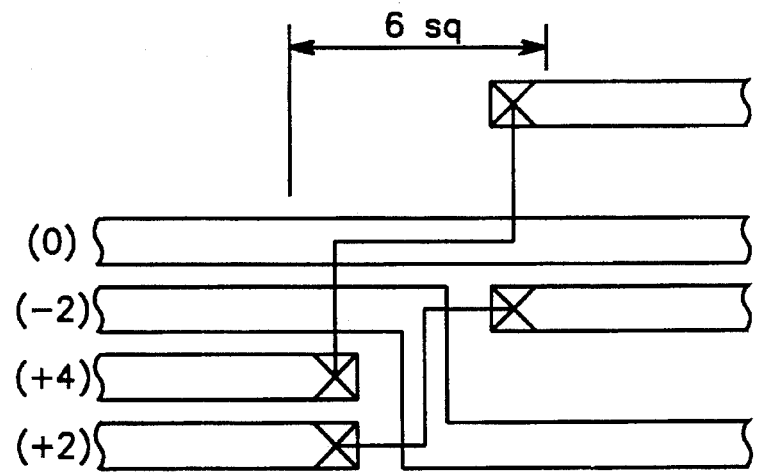
FIG. 13 depicts one physical embodiment of a twist region layout for the interconnection array structure of FIG. 7.
Figure 14:
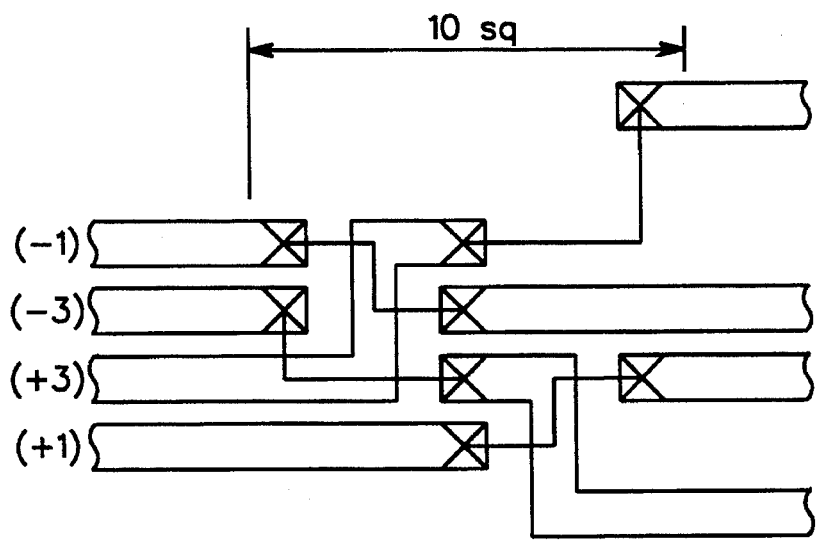
FIG. 14 depicts one physical embodiment of a twist region layout for the interconnection array of FIG. 5.
Figure 15:
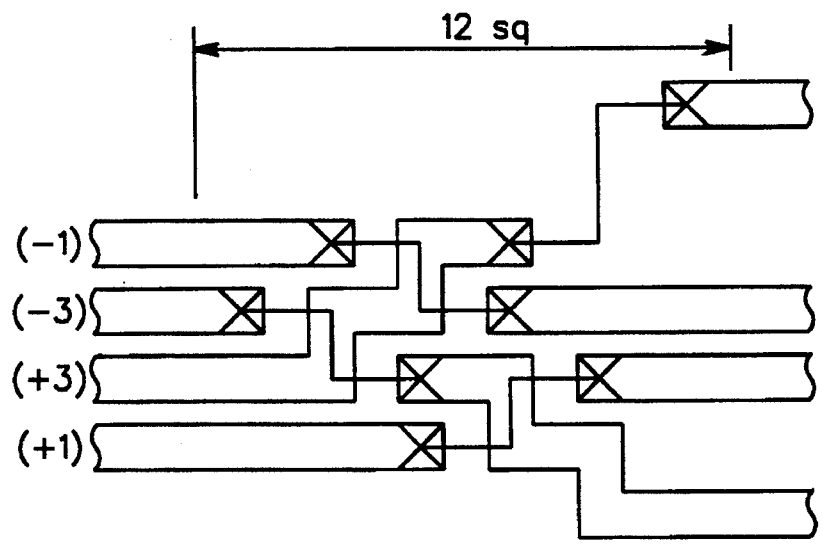
FIG. 15 depicts another physical embodiment of a twist region layout for the interconnection array of FIG. 5.

As with most "twisting" approaches, the densest crossing region layout does not necessarily have the best matching of resistance and capacitance within the region. By way of example, three crossing region layouts are presented in FIGS. 13, 14 & 15. FIG. 13 depicts the pattern of FIG. 7, while FIGS. 14 & 15 depict two different variations using the pattern of FIG. 5. The thin interconnection lines represent a second wiring level. Less dense layouts generally have better matching within the crossing region, which may or may not be important based upon the parameters of the technology at issue. Various alternative schemes for implementing each of the particular "twist" patterns presented herein can be devised. Further, if desired, in a memory array implementation the twisting scheme of the present invention may be disposed within the P (or N) channel portion of the sense amplifier if placed near the center of the array.

From the above discussion, those skilled in the art will note that a novel interconnection array and layout method have been presented. The array and layout method utilize a single "twist" region to simultaneously arrange pairs of line conductors such that intra-pair capacitive coupling is avoided and inter-pair capacitive couplings are matched. Because there is only a single twist, the interconnection array layout is more dense than prior art layouts requiring multiple "twist" regions. Thus, for example, in a semiconductor memory array employing a folded bit line architecture improved cell density is attainable. The layout is applicable to any interconnection array having a plurality of paired true/complement line conductors, such as integrated circuit address/data busses, and provides reduced power consumption in comparison with previous approaches.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. An interconnection array comprising:

a plurality of paired line conductors, each pair comprising a true line conductor and an associated complement line conductor;

said plurality of paired line conductors being substantially parallel within a first region and within a second region;

said plurality of paired line conductors crossing in a crossing region disposed between said first region and said second region;

said plurality of paired line conductors being located in said first region and said second region and being crossed in said crossing region such that no true line conductor is immediately adjacent to its associated complement line conductor in said first region and said second region; and, said plurality of paired line conductors further being located in said first region and said second region and being crossed in said crossing region such that for any given line conductor of said plurality of line conductors, capacitive coupling occurring in said first region and said second region between said given line conductor and immediately adjacent true line conductors of said plurality of line conductors is balanced by capacitive coupling occurring in said first region and said second region between said given line conductor and immediately adjacent complement line conductors associated with said immediately adjacent true line conductors.

2. The interconnection array of claim 1, wherein a first paired line conductor is disposed adjacent to an edge of the interconnection array in said first region, and wherein the complement line conductor of said first paired line conductor is disposed adjacent to a "dummy line conductor", said "dummy line conductor" being separate from said plurality of paired line conductors.

3. The interconnection array of claim 1, wherein first paired line conductors and second paired line conductors form a pattern in said crossing region and wherein said pattern is repeated in said interconnection array for additional pairs of paired line conductors of said plurality of paired line conductors.

4. The interconnection array of claim 1, wherein said crossing region is substantially transverse said plurality of line conductors of said first region and of said second region.

5. The interconnection array of claim 1, wherein said interconnection array comprises a substantially planar array and the center-to-center spacing between adjacent line conductors of said plurality of paired line conductors comprises one "pitch", and wherein multiple line conductors of said plurality of paired line conductors are offset "up" or "down" in said second region relative to said first region.

6. The interconnection array of claim 5, wherein said pattern comprises:

a first line conductor offset one pitch "down" in said second region relative to said first region;

a second line conductor located one pitch "down" from said first line conductor in said first region and offset three pitches "down" in said second region;

a third line conductor which is the complement of said first line conductor, located two pitches "down" from said first line conductor in said first region and offset three pitches "up" in said second region; and a fourth line conductor which is the complement of said second line conductor, located three pitches "down" from said first line conductor in said first region and offset one pitch "up" in said second region.

7. The interconnection array of claim 5, wherein said pattern comprises:

a first line conductor offset zero pitches in said second region relative to said first region;

a second line conductor located one pitch "down" from said first line conductor in said first region and offset two pitches "down" in said second region;

a third line conductor which is the complement of said first line conductor, located two pitches "down" from said first line conductor in said first region and offset four pitches "up" in said second region; and a fourth line conductor which is the complement of said second line conductor, located three pitches "down" from said first line conductor in said first region and offset two pitches "up" in said second region.

8. The interconnection array of claim 5, wherein said pattern comprises:

a first line conductor offset one pitch "up" in said second region relative to said first region;

a second line conductor located one pitch "down" from said first line conductor in said first region and offset one pitch "down" in said second region;

a third line conductor which is the complement of said first line conductor, located two pitches "down" from said first line conductor in said first region and offset five pitches "up" in said second region; and a fourth line conductor which is the complement of said second line conductor, located three pitches "down" from said first line conductor in said first region and offset three pitches "up" in said second region.

9. The interconnection array of claim 5, wherein said pattern comprises:

a first line conductor offset two pitches "down" in said second region relative to said first region;

a second line conductor located one pitch "down" from said first line conductor in said first region and offset two pitches "down" in said second region;

a third line conductor which is the complement of said first line conductor, located two pitches "down" from said first line conductor in said first region and offset two pitches "up" in said second region; and a fourth line conductor which is the complement of said second line conductor, located three pitches "down" from said first line conductor in said first region and offset zero pitches in said second region.

10. The interconnection array of claim 5, wherein said pattern comprises:

a first line conductor offset three pitches "down" in said second region relative to said first region;

a second line conductor located one pitch "down" from said first line conductor in said first region and offset six pitches "down" in said second region;

a third line conductor which is the complement of said first line conductor, located two pitches "down" from said first line conductor in said first region and offset one pitch "up" in said second region; and a fourth line conductor which is the complement of said second line conductor, located three pitches "down" from said first line conductor in said first region and offset one pitch "down" in said second region.

11. The interconnection array of claim 1, wherein said interconnection array comprises an array of bit lines within a semiconductor memory array.

12. The interconnection array of claim 1, wherein said interconnection array comprises an array of bit lines within a dynamic random access memory.

13. A line conductor layout method for an integrated circuit interconnection array having a plurality of paired line conductors of a given length, said line conductor layout method comprising the steps of:

(a) forming a first region of substantially parallel line conductors comprising a plurality of paired line conductors, each pair comprising a true line conductor and an associated complement line conductor;

(b) forming a second region of substantially parallel line conductors comprising a plurality of line conductors which correspond to said line conductors of said first region; and (c) forming a crossing region between said first region and said second region, said crossing region comprising a plurality of line conductors providing connections between line conductors of said first region and line conductors of said second region so as to provide a plurality of continuous true and complement line conductors extending from said first region through said crossing region to said second region, said line conductors of said crossing region connecting line conductors of said first region and said second region such that no true line conductor is immediately adjacent to its complement line conductor in said first region and no true line conductor is immediately adjacent to its complement line conductor in said second region, and further such that for any given line conductor of said plurality of line conductors, capacitive coupling occurring in said first region and said second region between said given line conductor and immediately adjacent true line conductors of said plurality of line conductors is balanced by capacitive coupling occurring in said first region and said second region between said given line conductor and immediately adjacent complement line conductors associated with said immediately adjacent true line conductors.

14. The line conductor layout method of claim 13, wherein said forming step (c) includes establishing a crossing pattern and forming said single crossing region by repeating said crossing pattern for successive pairs of line conductors.

15. The line conductor layout method of claim 13, wherein said forming steps (a) and (b) comprise forming a first metallization layer, and said forming step (c) comprises forming a second metallization layer to electrically interconnect corresponding line conductors in said first region and said second region.

* * * * *